United States Patent
Wu

(10) Patent No.: US 10,879,206 B1
(45) Date of Patent: Dec. 29, 2020

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/654,804

(22) Filed: Oct. 16, 2019

(51) Int. Cl.
| | |
|---|---|
| *H01L 23/498* | (2006.01) |
| *H01L 21/768* | (2006.01) |
| *H01L 23/00* | (2006.01) |
| *H01L 23/31* | (2006.01) |
| *H01L 23/48* | (2006.01) |

(52) U.S. Cl.
CPC ........ *H01L 24/29* (2013.01); *H01L 21/76898* (2013.01); *H01L 23/3142* (2013.01); *H01L 23/481* (2013.01); *H01L 23/49805* (2013.01); *H01L 23/49827* (2013.01); *H01L 24/27* (2013.01)

(58) Field of Classification Search
CPC ..................... H01L 21/76898; H01L 23/49827
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,786,580 B2 * | 10/2017 | Yang ..................... H01L 23/481 |
| 2012/0056328 A1 * | 3/2012 | Lai .......................... H01L 25/50 257/774 |
| 2014/0038390 A1 * | 2/2014 | Yang ..................... H01L 23/585 438/462 |

* cited by examiner

*Primary Examiner* — Daniel P Shook
(74) *Attorney, Agent, or Firm* — WPAT, P.C., Intellectual Property Attorneys; Anthony King

(57) ABSTRACT

A semiconductor structure includes a first substrate including a die region and a scribe line region adjacent to the die region, a through substrate via disposed in the first substrate in the scribe line region, a first connecting structure disposed over the first substrate in the die region, a second connecting structure disposed over the first substrate in the scribe line region and coupled to the through substrate via, a first bonding structure disposed over the first substrate in the die region and coupled to the first connecting structure, and a second bonding structure disposed over the first substrate in the scribe line region and coupled to the second connecting structure. The through substrate via, the second connecting structure and the second bonding structure are physically and electrically separated from the first connecting structure and the first bonding structure.

20 Claims, 14 Drawing Sheets

SEMICONDUCTOR STRUCTURE AND METHOD FOR FORMING THE SAME

BACKGROUND

The semiconductor industry has experienced rapid growth due to continuous improvements in the integration density of a variety of electronic components (e.g., transistors, diodes, resistors, capacitors, etc). This improvement allows more components to be integrated into a given area. As demands for miniaturization, higher speed and greater bandwidth, as well as lower power consumption and latency have grown recently, a need has arisen for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together using any of various suitable bonding techniques. The commonly used bonding techniques include direct bonding, chemically-activated bonding, plasma-activated bonding, anodic bonding, eutectic bonding, glass frit bonding, adhesive bonding, thermo-compressive bonding, reactive bonding and the like. An electrical connection may be provided between the stacked semiconductor wafers. The stacked semiconductor devices may provide greater density with smaller form factors and allow for increased performance and reduced power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
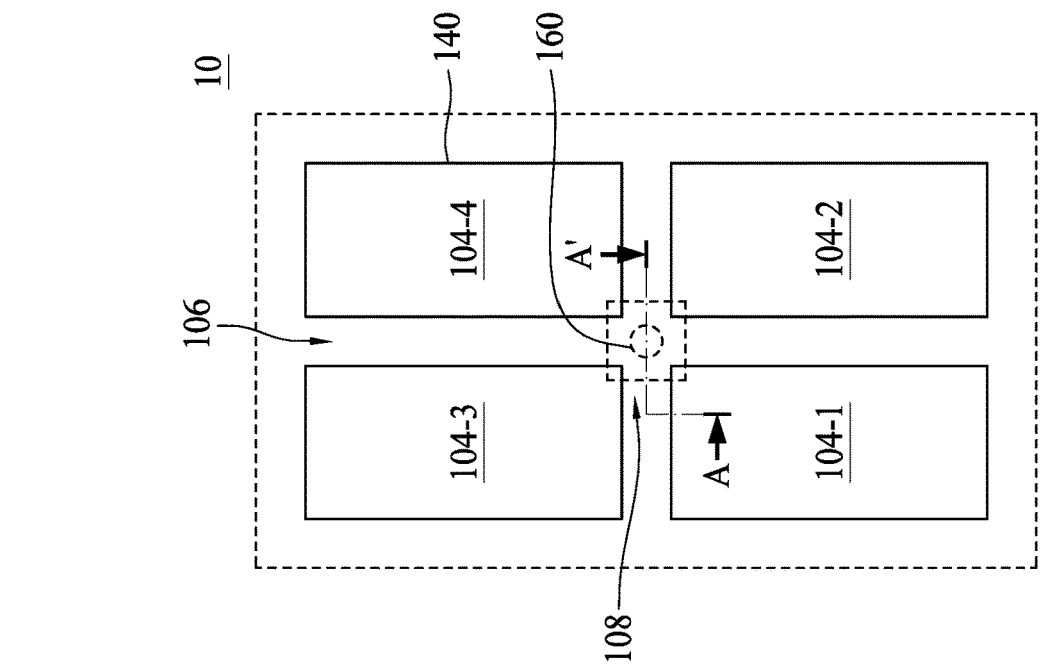
FIG. 1B is an enlarged view of a portion of a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; rather, the scope of the disclosure shall be defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The attachment mechanism between two semiconductor wafers or dies may utilize different bonding techniques. In some embodiments, the attachment mechanism between two semiconductor wafers or dies includes a screw, which may secure the two wafers or dies. For example, for a super-high performance and/or deep-learning technique, graphics processing unit (GPU) acceleration is required. In some embodiments, a plurality of GPU dies are formed in one wafer. Further, although the GPU dies may be respectively defined within die regions by scribe lines, such GPU dies are electrically connected to each other in order to construct a GPU wafer. The GPU wafer is then attached to a substrate for forming a 3DIC package. In some comparative embodiments, the attachment may be achieved by screws.

In such comparative embodiments, laser drilling may be performed to form holes penetrating the GPU dies at certain intersections of the scribe lines. Screws then are used to attach and secure the GPU wafer to the substrate. However, the laser drilling reduces mechanical strength of the wafer. Further, the die corner suffers from cracks due to stress generated from the laser drilling and screwing. Even though a die seal ring surrounding the die region is formed to protect the die corner from the stress generated from the laser drilling and the screwing, such die deal ring is not sufficient to resist the stress. In some comparative embodiments, a width of the screw is approximately 3 millimeters. In such comparative embodiments, to accommodate the large screw, the scribe lines are widened and thus the valuable die regions are reduced. In some comparative embodiments, a keep out zone (KOZ) is required between the screw and the die seal ring, and thus the valuable die region area is further reduced. Additionally, the die seal ring has a complicated pattern (i.e., an octagon-like pattern) for conserving space for the screw. In summary, in the comparative embodiments that use laser drilling and screwing to fix and secure a GPU wafer to a substrate, such comparative embodiments suffer from mechanical strength reduction, crack caused by stress, die region area reduction and complicated die seal ring pattern.

The present disclosure therefore provides a semiconductor package including a connecting pillar disposed within scribe lines for securing the wafer and the substrate. Because the connecting pillar can be formed with the forming of the many elements in the die, the reduction of the mechanical strength of the wafer is mitigated. Further, because the laser drilling and the screwing between the wafer and the substrate are replaced by the presence of the connecting pillar, the stress issue generated by the laser drilling and the screwing is eliminated. Thirdly, because a diameter or a width of the connecting pillar is less than a diameter or a width of the screw, the scribe lines can be narrowed and the valuable area of the die regions can be increased. Additionally, the pattern of the die seal ring can be simplified.

Figure 1A:
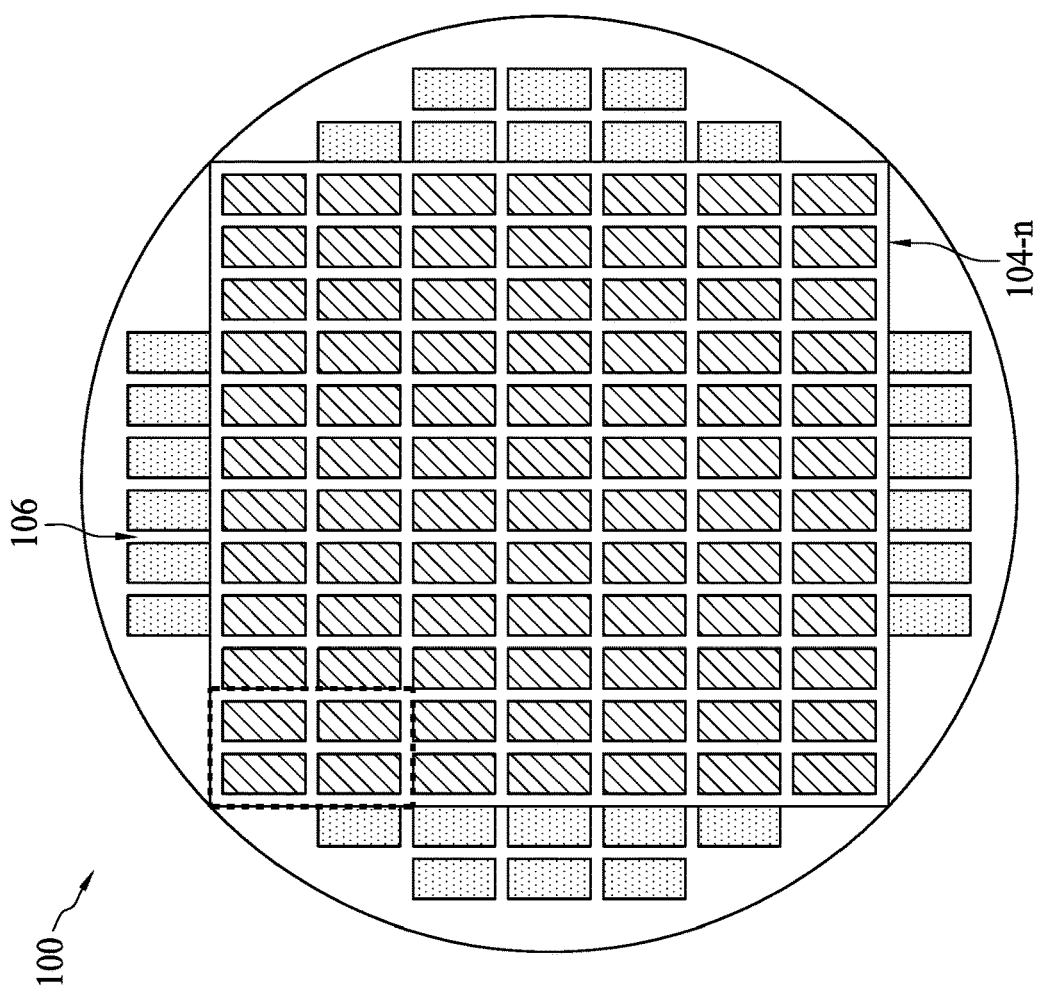
FIG. 1A is a top view illustrating a wafer according to aspects of the present disclosure.
Figure 2:
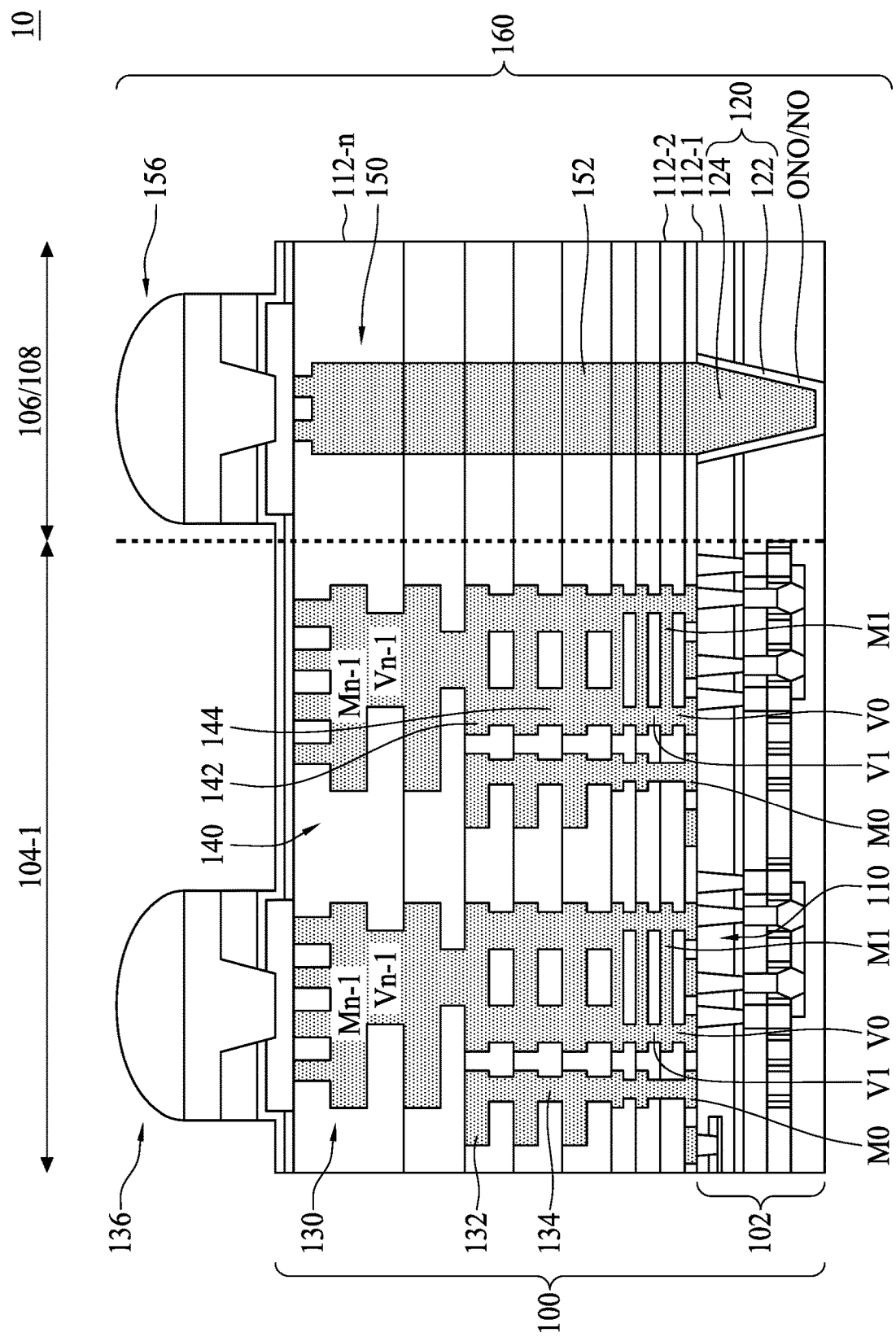
FIG. 2 is a cross-sectional view taken along a line A-A' of FIG. 1.

FIG. 1A is a top view illustrating a wafer according to aspects of the present disclosure, FIG. 1B is an enlarged view of a portion of a semiconductor structure according to aspects of the present disclosure, and FIG. 2 is a cross-sectional view taken along a line A-A' of FIG. 1B. As shown in FIGS. 1A, 1B and 2, a semiconductor structure 10 is provided. The semiconductor structure 10 can be a semiconductor package structure, but the disclosure is not limited thereto. The semiconductor structure 10 includes a wafer 100. In some embodiments, the wafer 100 includes a plurality of die regions 104-1, 104-2, 104-3, 104-4 and 104-$n$ defined thereon. In such embodiments, the plurality of die regions 104-1, 104-2, 104-3, 104-4 and 104-$n$ can be arranged in columns and rows to form an array, and the plurality of die regions 104-1, 104-2, 104-3, 104-4 and 104-$n$ are separated from each other by a scribe line region 106. As shown in FIGS. 1A and 1B, the scribe line region 106 may surround and be adjacent to each of the die regions 104-1, 104-2, 104-3, 104-4 and 104-$n$, and an intersection 108 surrounded by die corners of four different die regions such as 104-1, 104-2, 104-3, 104-4 and 104-$n$ can be observed.

The wafer 100 may include a substrate 102, as shown in FIG. 2. As shown in FIG. 2, the wafer 100 can include at least a semiconductor device 110 disposed in the substrate 102 in the die region 104-1. For example, each of the die regions 104-1, 104-2, 104-3, 104-4 and 104-$n$ can include many semiconductor devices, and by electrically connecting and/or electrically isolating such semiconductor devices, an integrated circuit can be formed in each of the die regions 104-1, 104-2, 104-3, 104-4 and 104-$n$. The semiconductor devices can be electrically isolated by an isolation structure such as shallow trench isolations (STI) and interlayer dielectric (ILD) layers. The semiconductor devices can be electrically connected by conductive structures disposed in the ILD layers and back-end-of-line (BEOL) metallizations. In some embodiments, the ILD layers and the conductive structures disposed in the ILD layers are a part of the substrate 102, as shown in FIG. 2. In some embodiments, the ILD layers include an insulating material such as silicon oxide, silicon nitride, undoped silicate glass (USG), borosilicate glass (BSG), a low-k dielectric material, TEOS, other suitable materials, and/or combination thereof. In some embodiments, the conductive structure disposed in the ILD includes copper (Cu), tungsten (W), aluminum (Al), or other suitable conductive material. In some embodiments, each of the die regions 104-1, 104-2, 104-3, 104-4 and 104-$n$ can include similar or different integrated circuits. In some embodiments, although the die regions 104-1, 104-2, 104-3, 104-4 and 104-$n$ are separated as shown in FIGS. 1A and 1B, the integrated circuits in the die regions 104-1, 104-2, 104-3, 104-4 and 104-$n$ can be electrically connected to each other, and thus a GPU wafer 100 is obtained.

In some embodiments, the semiconductor structure 10 includes a through substrate via 120 disposed in the substrate 102 in the scribe line region 106. In some embodiments, the through substrate via 120 is disposed in the intersection 108 of the scribe line region 106. In some embodiments, the through substrate via 120 penetrates the substrate 102 (including the ILD layers), as shown in FIG. 2. Further, the through substrate via 120 in the scribe line region 106 is separated from the semiconductor device 110 (and the integrated circuit) in the die region 104-1. In some embodiments, the through substrate via 120 includes an insulating layer 122 and a conductive layer 124. The conductive layer 124 is disposed on the insulating layer 122 and thus is separated from the substrate 102 by the insulating layer 122. In some embodiments, the conductive layer 124 can include aluminum (Al), copper (Cu), aluminum copper (AlCu), or other suitable conductive material. The insulating layer 122 disposed between the conductive layer 124 and the substrate 102 serves as a diffusion barrier. In some embodiments, the insulating layer 122 can be a dual-layered structure including a silicon oxide layer and a second nitride layer. The dual-layered insulating layer 122 therefore can be referred to as an ON barrier. In other embodiments, the insulating layer 122 can be a tri-layered structure including a two silicon oxide layers and a second nitride layer disposed between the two silicon oxide layers. The tri-layered insulating layer 122 therefore can be referred to as an ONO barrier.

Still referring to FIGS. 1A, 1B and 2, the semiconductor structure 10 includes connecting structures 130 and 140 disposed over the substrate 102 in the die region 104 and a connecting structure 150 disposed over the substrate 102 in the scribe line region 106. In some embodiments, the connecting structure 130 disposed in the die region 104-1 is electrically coupled to the semiconductor device 110 in the substrate 102. The connecting structure 130 coupled to the semiconductor device 110 serves as the BEOL interconnection metallization, which provides electrical connection between the semiconductor devices. The connecting structure 140 is disposed in each of the die regions 104-1, 104-2, 104-3, 104-4 and 104-$n$, and surrounds each of the die regions 104-1, 104-2, 104-3, 104-4 and 104-$n$, as shown in FIG. 1. The connecting structure 140 is disposed between the connecting structure 130 and the connecting structure 150. Further, the connecting structure 140 is separated from the connecting structure 130 and the connecting structure 150, as shown in FIG. 2. Each of the connecting structures 140 surrounds one die region 104-1, 104-2, 104-3, 104-4 and 104-$n$ and serves as a die seal ring, which protects the semiconductor device 110 from stresses generated during manufacturing operations. In some embodiments, the die seal ring 140 can be electrically connected to the semiconductor devices 110 in the substrate 102. In some alternative embodiments, the die seal ring 140 is electrically inactive or not electrically coupled to the devices. The connecting structure 150 disposed in the scribe line region 106 (i.e., the intersection 108 of the scribe line region 106) is aligned with and coupled to the through substrate via 120. In some embodiments, a height of the connecting structure (the BEOL interconnection structure) 130, a height of the connecting structure 140 (the die seal ring) and a height of the connecting structure 150 can be similar, as shown in FIG. 2.

Still referring to FIG. 2, the connecting structure 130 includes a plurality of dielectric layers 112-1, 112-2 and 112-$n$. In some embodiments, the dielectric layer 112-1 is formed over the substrate 102 (i.e., the ILD layer), and the dielectric layer 112-2 is formed on the dielectric layer 112-1. The dielectric layer 112-$n$ is formed over the dielectric layer 112-$n$−1. Accordingly, the plurality of dielectric layers 112-1, 112-2 and 112-$n$ can form a dielectric stack disposed to completely cover the substrate 102. The dielectric layer 112-1 is proximal to the substrate 102 while the dielectric layer 112-$n$ is distal to the substrate 102. The plurality of dielectric layers 112-1, 112-2 and 112-$n$ can include same or different materials. The plurality of dielectric layers 112-1, 112-2 and 112-$n$ are inter-metal dielectric (IMD) layers. In some embodiments, the dielectric layers 112-1, 112-2 and 112-$n$ can include materials such as silicon oxide, silicon nitride, silicon oxynitride, low-k dielectric materials (usually having a dielectric constant lower than 3), ultra low-k dielectric materials (usually having a dielectric constant lower than 2.6), other dielectric materials, and/or combinations thereof.

The connecting structure 130 further includes a plurality of conductive lines 132 in the dielectric layers 112-1, 112-2 and 112-$n$, and a plurality of vias 134 electrically coupling the conductive lines 132 in different dielectric layers 112-1, 112-2 and 112-$n$. In some embodiments, the conductive lines 132 formed in the dielectric layer 112-1 can be referred to as a zeroth metallization (M0) layer, which is directly electrically coupled to the conductive structure in the ILD layers. The conductive lines 132 formed in the dielectric layer 112-2, which is over the dielectric layer 112-1 and the M0 layer, is referred to as a first metallization (M1) layer. The M1 layer is shown in FIG. 2 herein for illustrative purposes, and the embodiments may utilize one or more other metallization layers, such as a second metallization (M2) layer to an upper most metallization (Mn−1) layer. Further, the via used to electrically couple the M0 layer and the M1 layer can be referred to as a zeroth via (V0). V0 is shown in FIG. 2 for illustrative purposes, and the embodiments may utilize one or more other vias for electrically coupling the metallization layers in different dielectric layers, such as a first via (V1) to an upper most via (Vn−2).

The connecting structure 140, that is the die seal ring 140, further includes a plurality of conductive lines 142 in the dielectric layers 112-1, 112-2 and 112-$n$, and a plurality of vias 144 electrically coupling the conductive lines 142 in different dielectric layers 112-1, 112-2 and 112-$n$. In some embodiments, the conductive lines 142 formed in the dielectric layer 112-1 can also be referred to as the M0 layer, which is electrically coupled to the conductive structure in the ILD layers. The conductive lines 142 formed in the dielectric layer 112-2, which is over the dielectric layer 112-1 and the M0 layer, is also referred to as the M1 layer. The M1 layer is shown in FIG. 2 for illustrative purposes, and the embodiments may utilize one or more other metallization layers, such as the M2 layer to the upper most metallization layer Mn−1. Further, the via used to electrically couple the M0 layer and the M1 layer can be referred to as a V0. The V0 is shown in FIG. 2 for illustrative purposes, and the embodiments may utilize one or more other vias for electrically coupling the metallization layers in different dielectric layers, such as a first via (V1) to an upper most via (Vn−2). In some embodiments, a quantity of the metallization layers of the connecting structure (the die seal ring) 140 is similar to a quantity of the metallization layers of the connecting structure (the BEOL interconnection structure) 130.

The connecting structure 150 in the scribe line region 106 includes a plurality of conductive features 152 disposed in the dielectric layers 112-1, 112-2 and 112-$n$, and the conductive features 152 are all coupled to each other, as shown in FIG. 2. In some embodiments, a thickness of the conductive feature 152 of the connecting structure 150, a thickness of the conductive line 132 of the connecting structure 130, and a thickness of the conductive line 142 of the connecting structure 140 in one same dielectric layer are similar. For example, the thickness of the conductive feature 152 in the dielectric layer 112-1, the thickness of the conductive line 132 in the dielectric layer 112-1 and the thickness of the conductive line 142 in the dielectric layer 112-1 are similar. Further, the thicknesses of the conductive feature 152 in the dielectric layer 112-1, the conductive line 132 in the dielectric layer 112-1 and the conductive line 142 in the dielectric layer 112-1 are similar to a thickness of the dielectric layer 112-1. In summary, a thickness of the M0 layer in the connecting structures 130 and 140, the thickness of the conductive feature 152 of the connecting structure 150, and thickness of the dielectric layer 112-1 are similar.

In some embodiments, a thickness of the conductive feature 152 of the connecting structure 150, a sum of a thickness of the via 134 and a thickness of the conductive line 132 of the connecting structure 130, and a sum of a thickness of the via 144 and a thickness of the conductive line 142 of the connecting structure 140 in one same dielectric layer are similar. For example, the thickness of the conductive feature 152 in the dielectric layer 112-2, the sum of the thickness of the conductive line 132 and the via 134 in the dielectric layer 112-2, and the sum of the thickness of the conductive line 142 in the dielectric layer 112-2 are similar. Further, the thickness of the conductive feature 152 in the dielectric layer 112-2, the sum of the thickness of the conductive line 132 and the thickness of the via 134 in the dielectric layer 112-2 and the sum of the thickness of the conductive line 142 and the thickness of the via 144 in the dielectric layer 112-2 are similar to a thickness of the dielectric layer 112-2. In summary, a sum of a thickness of the M1 layer and a thickness of the V0 in the connecting structures 130 and 140, the thickness of the conductive feature 152 of the connecting structure 150, and the thickness of the dielectric layer 112-2 are similar. In some embodiments, the widths of the connecting structures 130 and 140 are greater than a width of the connecting structure 150, but the disclosure is not limited thereto.

Additionally, in some embodiments, the substrate 102, the semiconductor device 110, the through substrate via 120 in the substrate, and the connecting structures 130, 140 and 150 together are referred to as the wafer 100, as shown in FIG. 2.

Still referring to FIGS. 1A, 1B and 2, the semiconductor structure 10 further includes a bonding structure 136 disposed over the substrate 102 in the die regions 104-1, 104-2, 104-3, 104-4 and 104-n. For example, the bonding structure 136 is disposed in the die region 104-1 and coupled to the connecting structure 130. Accordingly, the bonding structure 136 serves as a terminal providing external connection. In some embodiments, the bonding structure 136 can include a bonding pad, connecting vias electrically coupling the bonding pad to the Mn-1 layer, an under bump metallization (UBM) layer, a bump and a solder. The semiconductor structure 10 further includes a bonding structure 156 disposed over the substrate 102 in the scribe line region 106 and coupled to the connecting structure 150. The bonding structure 136 is separated from the bonding structure 156, as shown in FIG. 2. In some embodiments, the bonding structure 156 can include a bonding pad, connecting vias electrically coupling the bonding pad to the top most conductive feature 152, a UBM layer, a bump and a solder. Further, the through substrate via 120, the connecting structure 150 and the bonding structure 156 form a connecting pillar 160 disposed in the scribe line region 106, such as in the intersection 108 of the scribe line region 106. As shown in FIGS. 1A, 1B and 2, the connecting pillar 160 penetrates the wafer 100. Further, the connecting pillar 160 (i.e., the through substrate via 120, the connecting structure 150 and the bonding structure 156) is separated from the die seal rings 140, the connecting structure 130 and the bonding structure 136. In some embodiments, a height of the connecting pillar 160 is greater than a thickness of the wafer 100.

Figure 3:
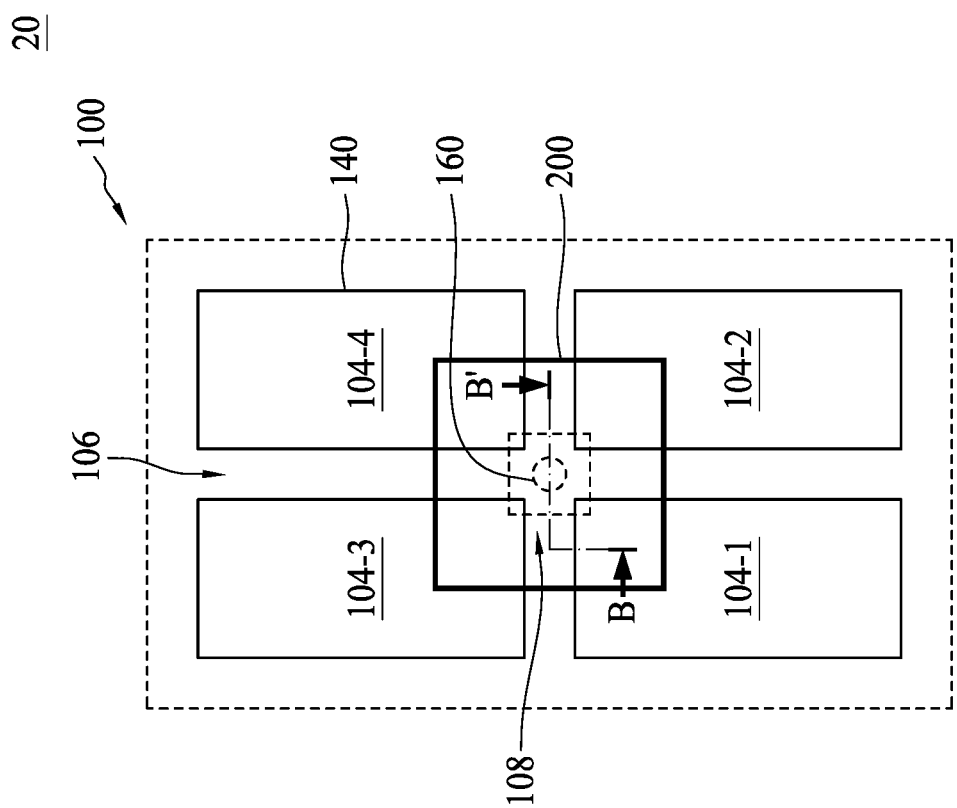
FIG. 3 is a top view illustrating a semiconductor structure according to aspects of the present disclosure.
Figure 4:
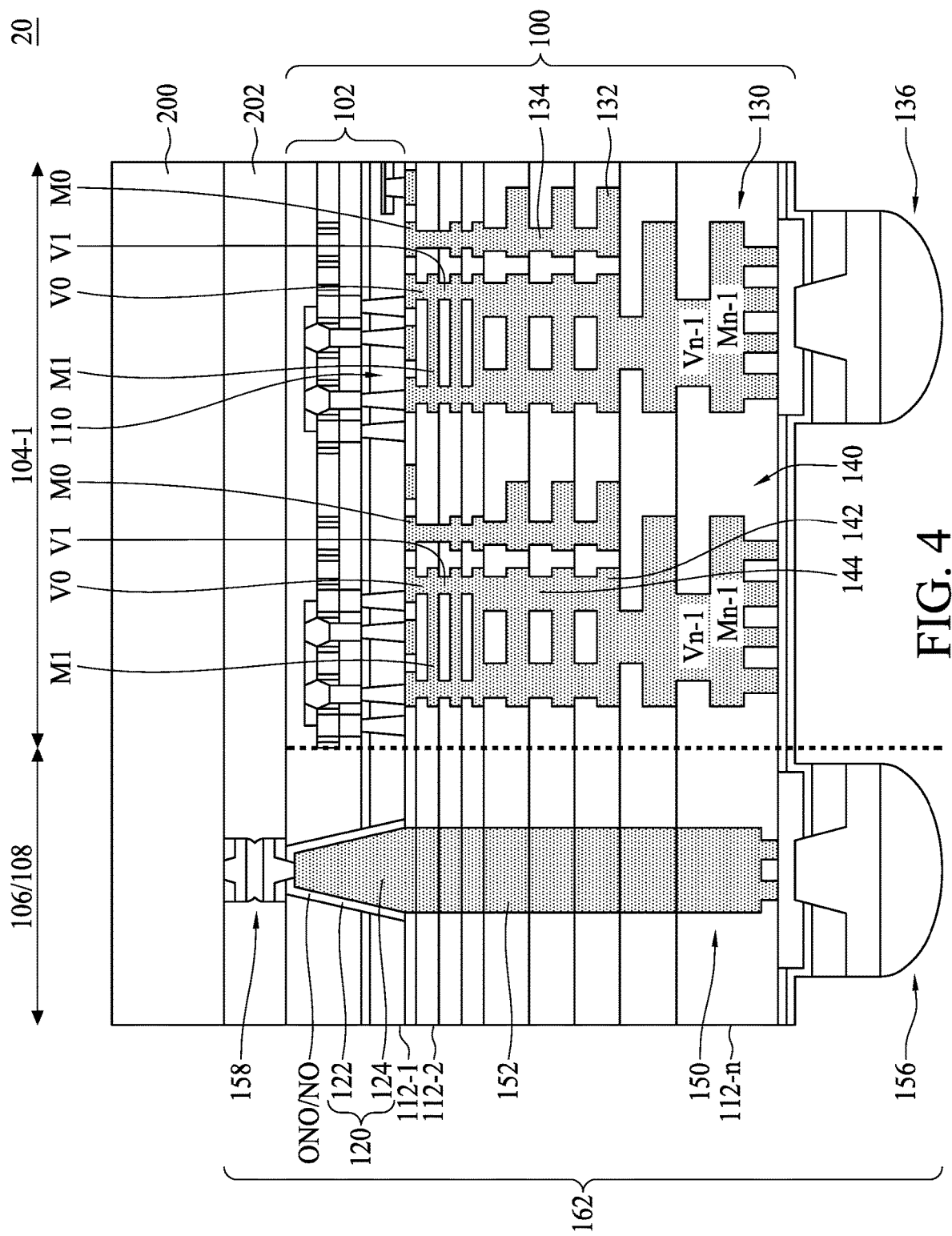
FIG. 4 is a cross-sectional view taken along a line B-B' of FIG. 3.

FIG. 3 is a top view illustrating a portion of a semiconductor structure 20 according to aspects of the present disclosure, and FIG. 4 is a cross-sectional view taken along a line B-B' of FIG. 3. It should be noted that same elements in FIGS. 1A to 2 and 3 to 4 are indicated by the same numerals, and repetitive descriptions of the elements shown in FIGS. 1A to 2 and 3 to 4 are omitted in the descriptions of FIGS. 3 and 4 for brevity. In some embodiments, the semiconductor structure 20 includes another bonding structure 158 disposed over the substrate 102 over a surface opposite to the bonding structure 156 and coupled to the through substrate via 120. In some embodiments, the bonding structure 156, the connecting structure 150, the through substrate via 120 and the bonding structure 158 are aligned with each other and coupled to each other to form a connecting pillar 162.

In some embodiments, another substrate 200 or another die 200 can be provided. The die 200 can be a memory die such as a dynamic random access memory (DRAM) die or a high bandwidth memory (HBM) die, but the disclosure is not limited thereto. As shown in FIG. 2, the die 200 is disposed over the wafer 100. In some embodiments, the die 200 may be disposed to overlap a portion of the die region 104-1, 104-2, 104-3, 104-4 and/or 104-n. The die 200 is disposed to overlap a portion of the scribe line region 106, such as the intersection 108 of the scribe line region 106. Further, the die 200 may overlap the connecting pillar 162, as shown in FIG. 4. Significantly, the die 200 is bonded to the wafer 100 through the bonding structure 158. In some embodiments, an underfill 202 can be applied between the die 200 and the wafer 100, such that the bonding structure 158 is surrounded by the underfill 202. Accordingly, the wafer 100 and the die 200 are fixed to each other by the connecting pillar 162 disposed in the scribe line region 106 to form the semiconductor structure 20.

In some embodiments, a width or a diameter of the connecting pillars 160 and 162, such as the maximum width of the bonding structure 156, is between approximately 3 µm and approximately 6 µm. Comparing the connecting pillars 160 and 162 to the screw used in some comparative embodiments, the width or diameter of the attachment mechanism is reduced from several millimeters to several micrometers. Thus, the space occupied by the connecting pillars 160 and 162 in the present disclosure is less than the space occupied by the screw in the comparative embodiments. Therefore, a width of the scribe line region 106 which is used to accommodate the connecting pillars 160 and 162 can be reduced, and thus areas of the valuable die regions 104-1, 104-2, 104-3, 104-4 and 104-n can be increased. Further, because laser drilling and screwing are not required, a keep-out zone is not required. Thus, the areas of the valuable die regions 104-1, 104-2, 104-3, 104-4 and 104-n can be further increased. In some embodiments, because the space occupied by the connecting pillars 160 and 162 is less than the space occupied by the screw in the comparative embodiments, the die seal ring 140 can be formed in a simpler pattern, such as a rectangular shape, instead of an octagonal shape.

In summary, by providing the connecting pillars 160 and 162, the width of the scribe line region 106 can be reduced, the areas of the die regions 104-1, 104-2, 104-3, 104-4 and 104-n can be increased to accommodate more devices, and the pattern of the die seal ring 140 can be simplified. Further, the wafer crack issue can be mitigated. Accordingly, the semiconductor structures 10 and 20 are more suitable for super-high-performance system.

Figure 5:
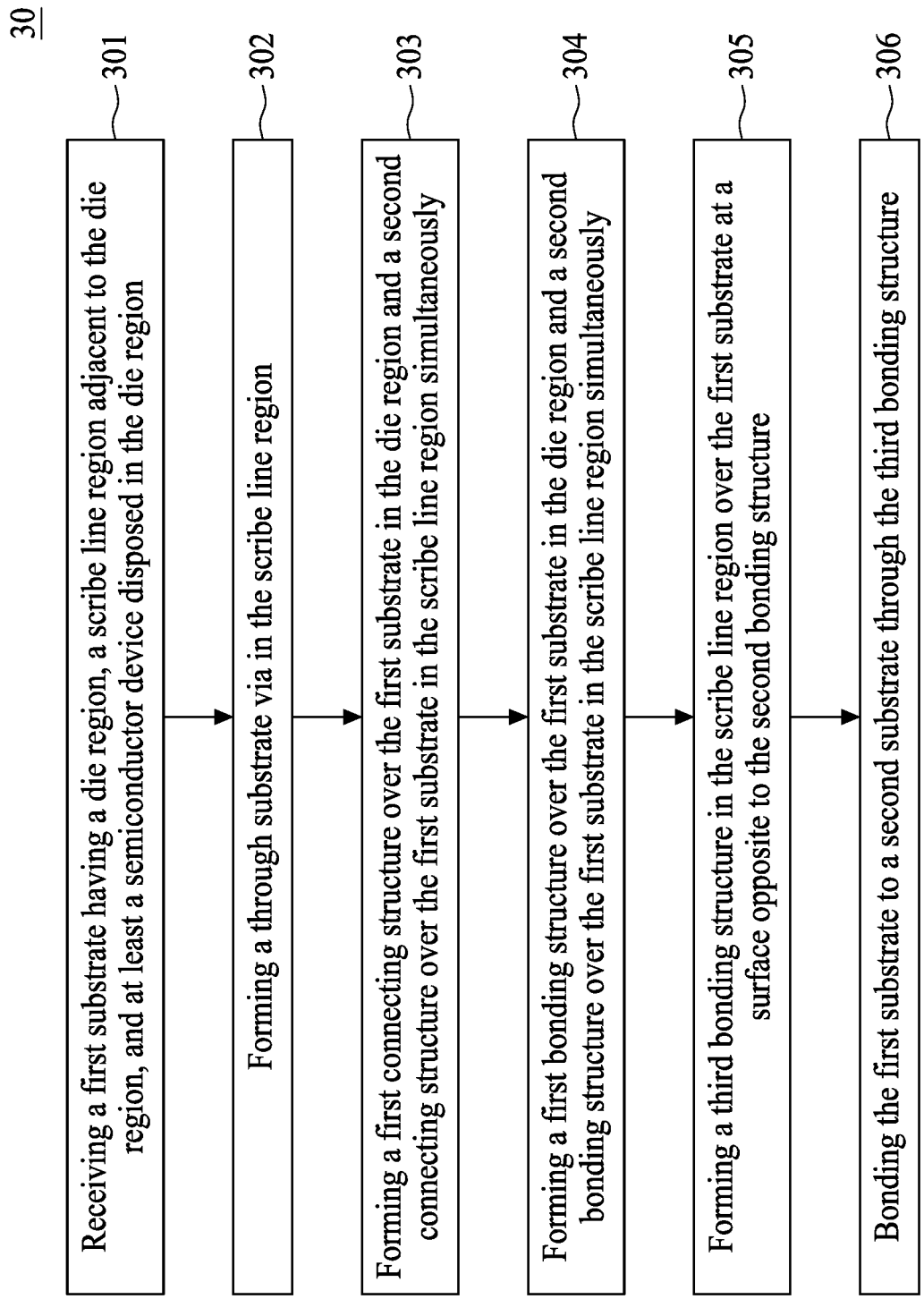
FIG. 5 is a flowchart representing a method for forming a semiconductor structure according to aspects of the present disclosure.

FIG. 5 is a flowchart representing a method for forming a semiconductor structure 30 according to aspects of the present disclosure, and FIGS. 6A-6I are schematic drawings illustrating stages of the method for forming a semiconductor structure 30 according to aspects of the present disclosure. The method 30 includes a number of operations (301, 302, 303, 304, 305 and 306). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

At operation 301, a substrate 102 is received or provided. The substrate 102 may include a plurality of die regions 104-1, 104-2, 104-3, 104-4 and 104-n separated from each other by a scribe line region 106, as mentioned above and shown in FIGS. 1A, 1B and 6A. The scribe line region 106 may surround and be adjacent to each of the die regions 104-1, 104-2, 104-3, 104-4 and 104-n, and an intersection 108 that are surrounded by die corners of four different die regions such as 104-1, 104-2, 104-3, 104-4 and 104-n can be observed.

Figure 6A:
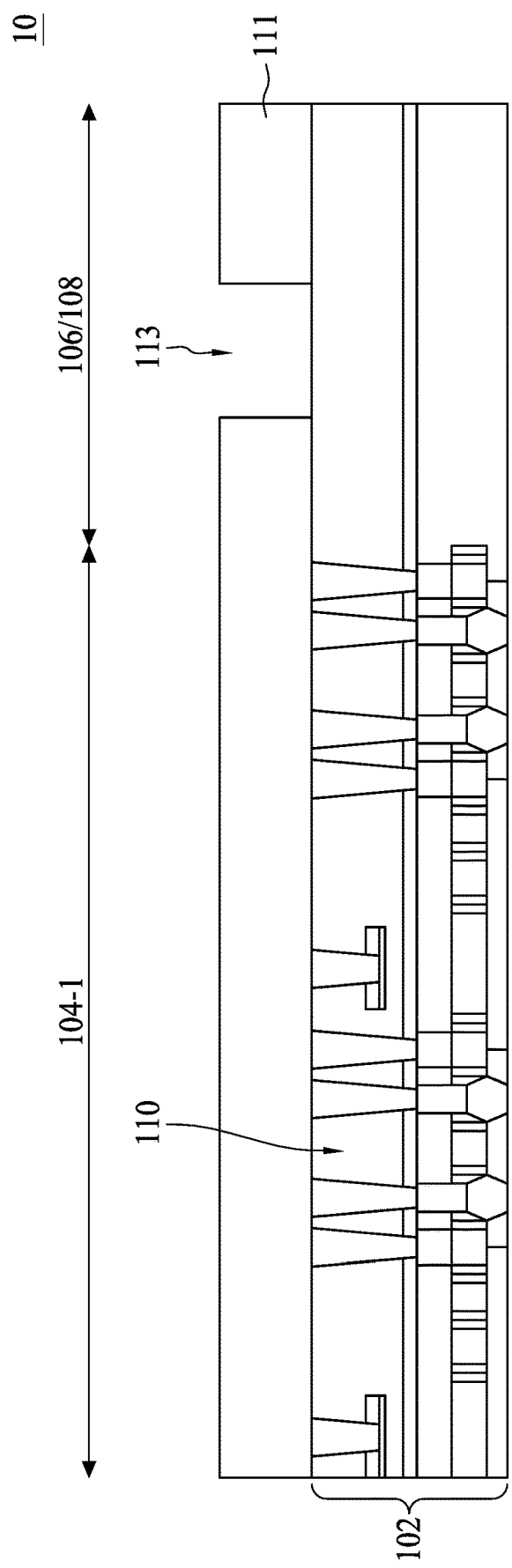
FIGS. 6A-6I are schematic drawings illustrating stages of a method for forming a semiconductor structure according to aspects of the present disclosure.

At least a semiconductor device 110 can be disposed in the substrate 102 in the die region 104-1, as shown in FIG. 6A. As mentioned above, each of the die regions 104-1, 104-2, 104-3, 104-4 and/or 104-n can include many semiconductor devices, and by electrically connecting and/or isolating the semiconductor devices, an integrated circuit can be formed in each of the die regions 104-1, 104-2, 104-3, 104-4 and 104-n. Further, the semiconductor devices can be electrically connected by conductive structures disposed in the ILD layers. In some embodiments, the ILD layers and the conductive structures disposed in the ILD layers are taken as a part of the substrate 102, as shown in FIG. 6A. In some embodiments, each of the die regions 104-1, 104-2, 104-3, 104-4 and 104-n can include similar or different integrated circuits. In some embodiments, although the die regions 104-1, 104-2, 104-3, 104-4 and 104-n are separated, the integrated circuits in the die regions 104-1, 104-2, 104-3, 104-4 and 104-n can be electrically connected to each other to form a GPU wafer. In some embodiments, a patterned mask 111 is formed over the substrate 102. As shown in FIG. 6A, the patterned mask 111 can include an opening 113 defining a location and a size of a through substrate via to be formed.

Figure 6B:
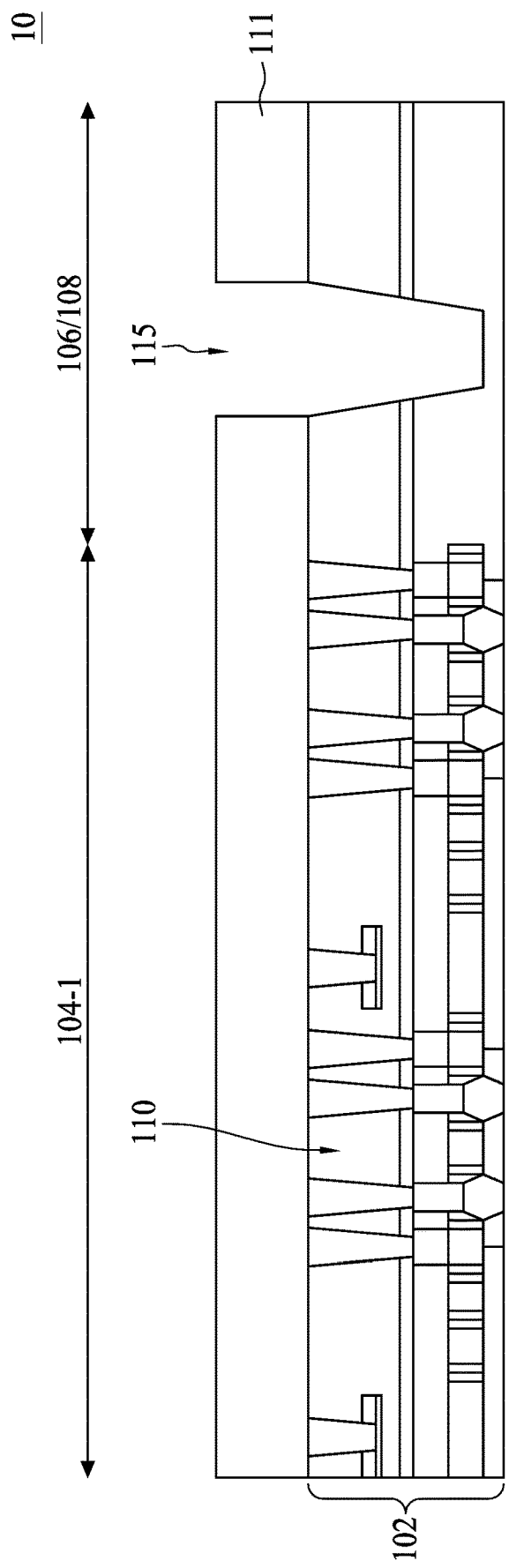

Referring to FIG. 6B, an etching operation is performed to remove a portion of the substrate 102 through the patterned mask 111. Consequently, a recess 115 is formed in the substrate 102, and the substrate 102 may be exposed through a bottom and sidewall of the recess 115. As shown in FIG. 6B, the recess 115 is formed in the scribe line region 106. In some embodiments, the recess 115 is formed in the intersection 108 of the scribe line region 106. In some embodiments, the recess 115 accommodates a via structure serving as a portion of a connecting pillar 160 or 162, which provides physical and electrical connection between the substrate 102 and another substrate or die. In some embodiments, a width or a diameter of the recess 115 is between approximately 3 μm and approximately 6 μm. Comparing the width of the recess 115 with the diameter of the screw used in some comparative embodiments, the width or diameter of the attachment mechanism is reduced from several millimeters to several micrometers. Therefore a width of the scribe line region 106 can be reduced, and thus areas of the valuable die regions 104-1, 104-2, 104-3, 104-4 and 104-n can be increased. Further, because laser drilling and screwing are not required, a keep-out zone is not required. Thus, the areas of the valuable die regions 104-1, 104-2, 104-3, 104-4 and 104-n can be further increased.

Figure 6C:
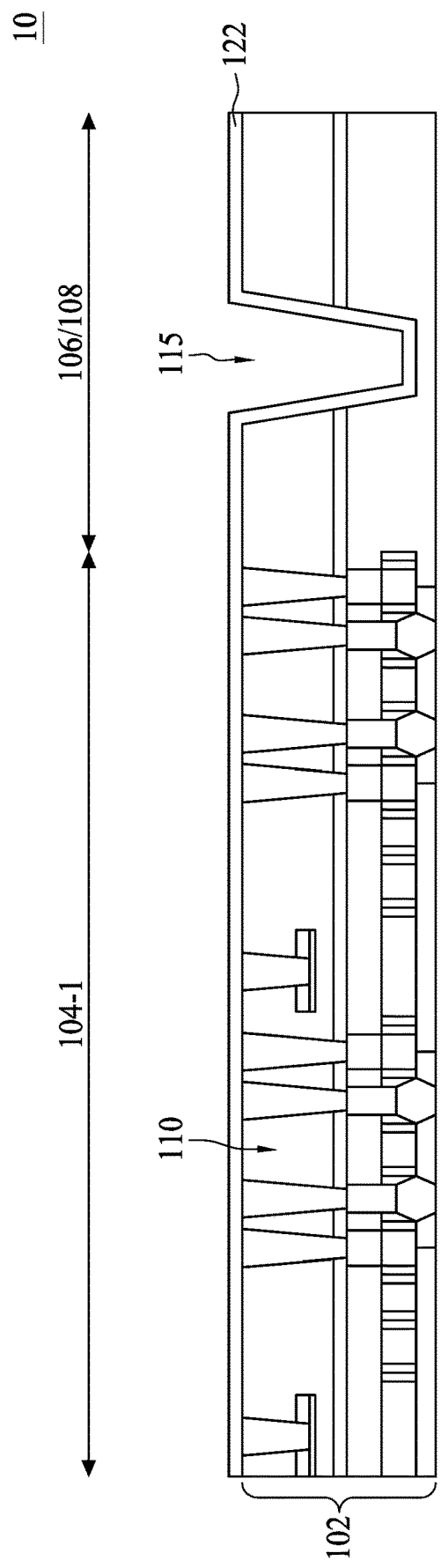

Referring to FIG. 6C, after the forming of the recess 115, the patterned mask 111 can be removed. Thereafter, an insulating layer 122 is formed in the recess 115. As mentioned above, the insulating layer 122 serves as a diffusion barrier. In some embodiments, the insulating layer 122 can be a dual-layered layer, such as an ON barrier. In other embodiments, the insulating layer 122 can be a tri-layered layer, such as an ONO barrier.

Figure 6D:
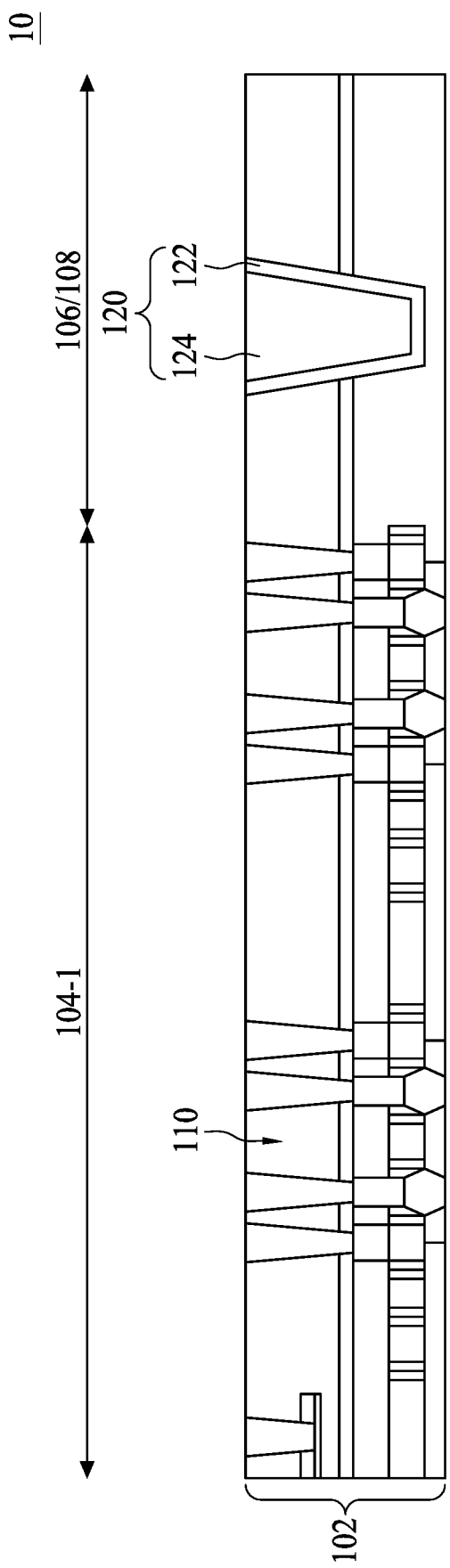

At operation 302, a through substrate via 120 is formed in the scribe line region 106. Referring to FIG. 6D, a conductive layer 124 is formed on the insulating layer 122, and thus is separated from the substrate 102 by the insulating layer 122. Subsequently, a planarization operation, such as a chemical mechanical polish (CMP) operation can be performed to remove superfluous materials, such as portions of the insulating layer 122 and portions of the conductive layer 124 covering the substrate 102, from the substrate 102. Consequently, the through substrate via 120 is formed in the scribe line region 106. Additionally, a top surface of the substrate 102 can be exposed, as shown in FIG. 6D.

Figure 6E:
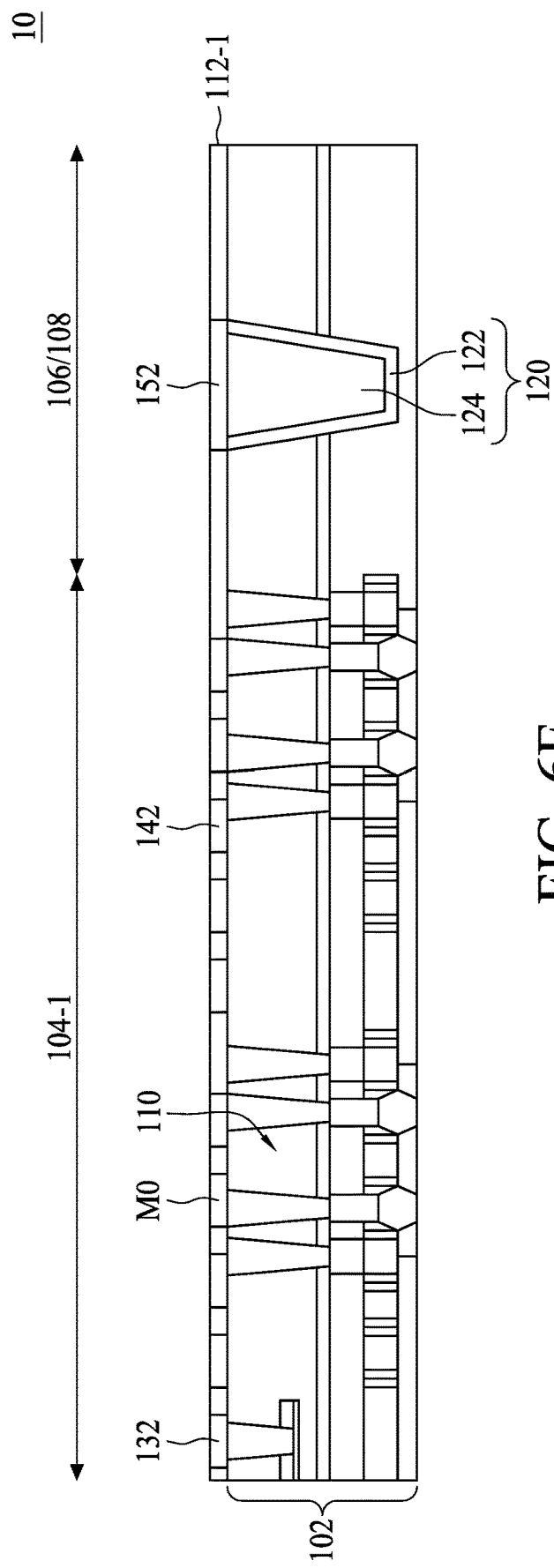

At operation 303, connecting structures 130 and 140 are formed over the substrate 102 in the die region 104-1, and a connecting structure 150 is formed over the substrate 102 in the scribe line region 106. In some embodiments, the forming of the connecting structures 130, 140 and 150 can include further operations. For example, as shown in FIG. 6E, in some embodiments, a dielectric layer 112-1 can be formed over the substrate 102. Further, conductive lines 132 and 142 can be formed in the dielectric layer 112-1 in the die region 104-1 and a conductive feature 152 can be simultaneously formed in the dielectric layer 112-1 in the scribe line region 106. The conductive lines 132 and 142 and the conductive feature 152 are separated from each other by the dielectric layer 112-1. As shown in FIG. 6E, the conductive line 132 serves as a portion of a BEOL interconnection structure, and therefore the conductive line 132 can be electrically coupled to the conductive structure in the ILD layers of the substrate 102. The conductive line 142 can be formed between the conductive line 132 and the conductive feature 152 and serve as a portion of a die seal ring. In some embodiments, the conductive line 142 can be electrically coupled to devices disposed in the substrate 102. In other embodiments, the conductive line 142 can be electrically isolated from the devices in the substrate 102. The conductive feature 152 in the scribe line region 106 can be formed to align with and coupled to the through substrate via 120. In some embodiments, a width of the conductive feature 152 is similar to the width of the through substrate via 120, but the disclosure is not limited thereto. In some embodiments, the width of the conductive feature is greater than a width of the conductive line 132 and a width of the conductive line 142. In some embodiments, a thickness of the dielectric layer 112-1, a thickness of the conductive feature 152 in the scribe line region 106, a thickness of the conductive line 132, and a thickness of the conductive line 142 are similar. In some embodiments, the conductive lines 132 and 142 and the conductive feature 152, which are proximal to the substrate 102, can be referred to as the M0 layer.

Figure 6F:
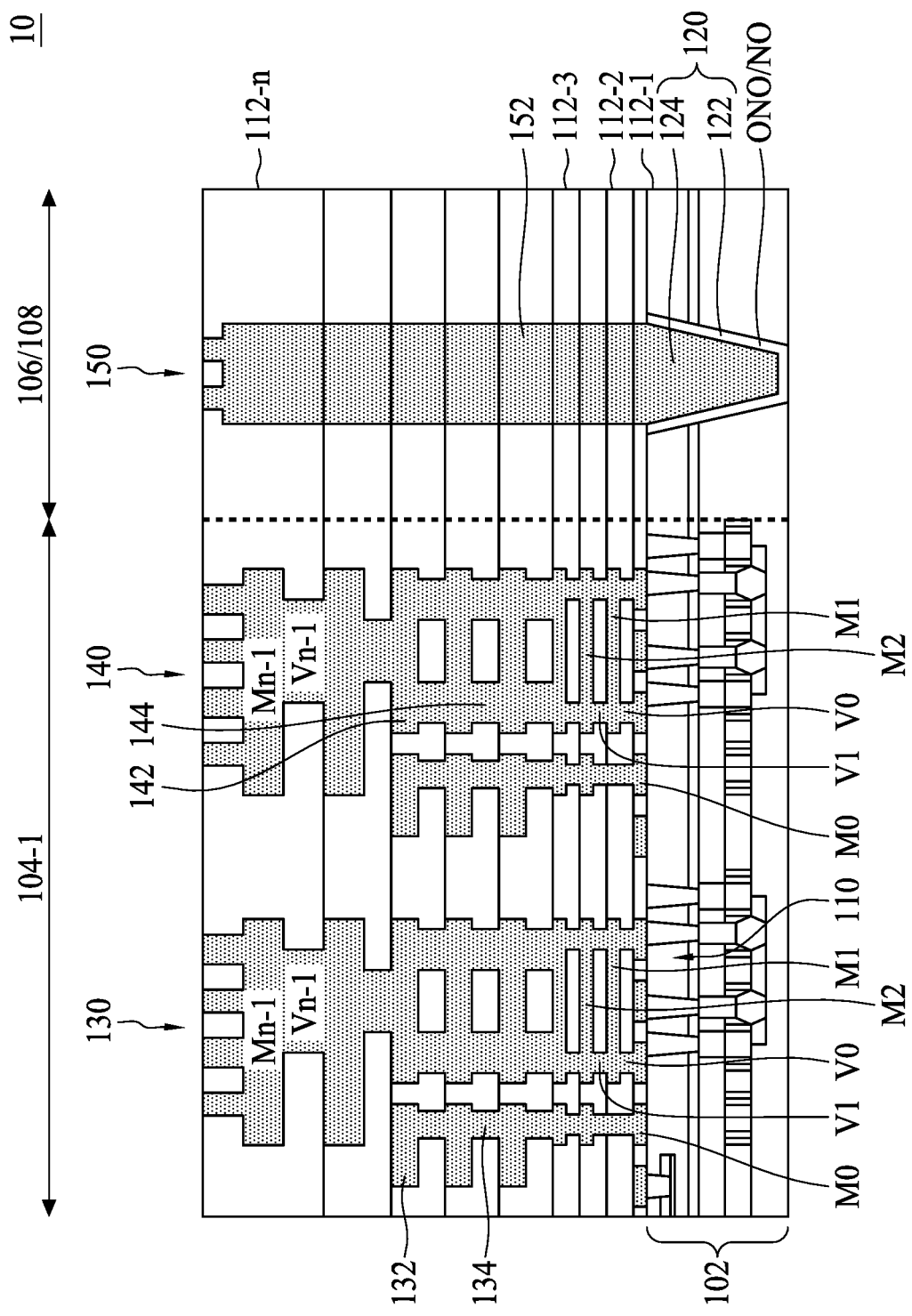

Referring to FIG. 6F, in some embodiments, another dielectric layer 112-2 can be formed over the dielectric layer 112-1. Next, vias 134 and 144, conductive lines 132 and 142, and a conductive feature 152 can be simultaneously formed in the dielectric layer 112-2. As shown in FIG. 6F, the conductive lines 132 and via 134 are formed in the die region 104-1, the conductive feature 152 is formed in the scribe line region 106, and the conductive line 142 and the via 144 are formed in the die region 104-1 but between the conductive feature 152 and the conductive line/via 132 and 134. Further, the conductive lines 132 in the dielectric layers 112-1 and 112-2 are electrically coupled through the via 134. The conductive lines 142 in the dielectric layers 112-1 and 112-2 are electrically coupled through the via 144. In contrast to the conductive lines/vias in the die region 104-1, the conductive feature 152 in the dielectric layer 112-2 is electrically and physically coupled to the conductive feature 152 in the dielectric layer 112-1. In some embodiments, a thickness of the dielectric layer 112-2, a thickness of the conductive feature 152 in the dielectric layer 112-2, a sum of a thickness of the conductive line 132 and a thickness of the via 134 in the dielectric layer 112-2, and a sum of a thickness of the conductive line 142 and a thickness of the via 144 in the dielectric layer 112-2 are similar.

Still referring to FIG. 6F, operations for forming the conductive lines 132 and 142, the vias 134 and 144, and the conductive feature 152 can be performed repeatedly. Consequently, the connecting structures 130 and 140 are formed in the die region 104-1, and the connecting structure 150 is formed in the scribe line region 106. As mentioned above, the connecting structure 130 serves as a BEOL interconnection structure and is electrically coupled to the semiconductor device 110 in the substrate 102. The connecting structure 140 serves as a die seal ring. The connecting structure 150 serves as a portion of a connecting pillar and is coupled to the through substrate via 120. Further, the conductive lines 132 and 142 disposed in the dielectric layer 112-2 can be referred to as the M1 layer. The M1 layer is shown in FIG. 6F for illustrative purposes, and the embodiments may utilize one or more other metallization layers, such as a second metallization layer (M2) in the dielectric layer 112-3 to an upper most metallization layer (Mn−1) in the dielectric layer 112-n. The vias 134 and 144 used to electrically couple the M0 layer to the M1 layer can be referred to as a zeroth via (V0). The V0 is shown in FIG. 6F for illustrative purposes, and the embodiments may utilize one or more other vias for electrically coupling the metallization layers in different dielectric layers, such as a first via (V1) to an uppermost via (Vn−2). The conductive lines/vias 132 and 134 of the connecting structure 130 and the conductive lines/vias 142 and 144 of the connecting structure 140 can have various design layout, according to different product requirements. In contrast to the connecting structures 130 and 140, the conductive features 152 of the connecting structure 150 are aligned with each other and coupled to each other to form a pillar-like structure, as shown in FIG. 6F.

Figure 6G:
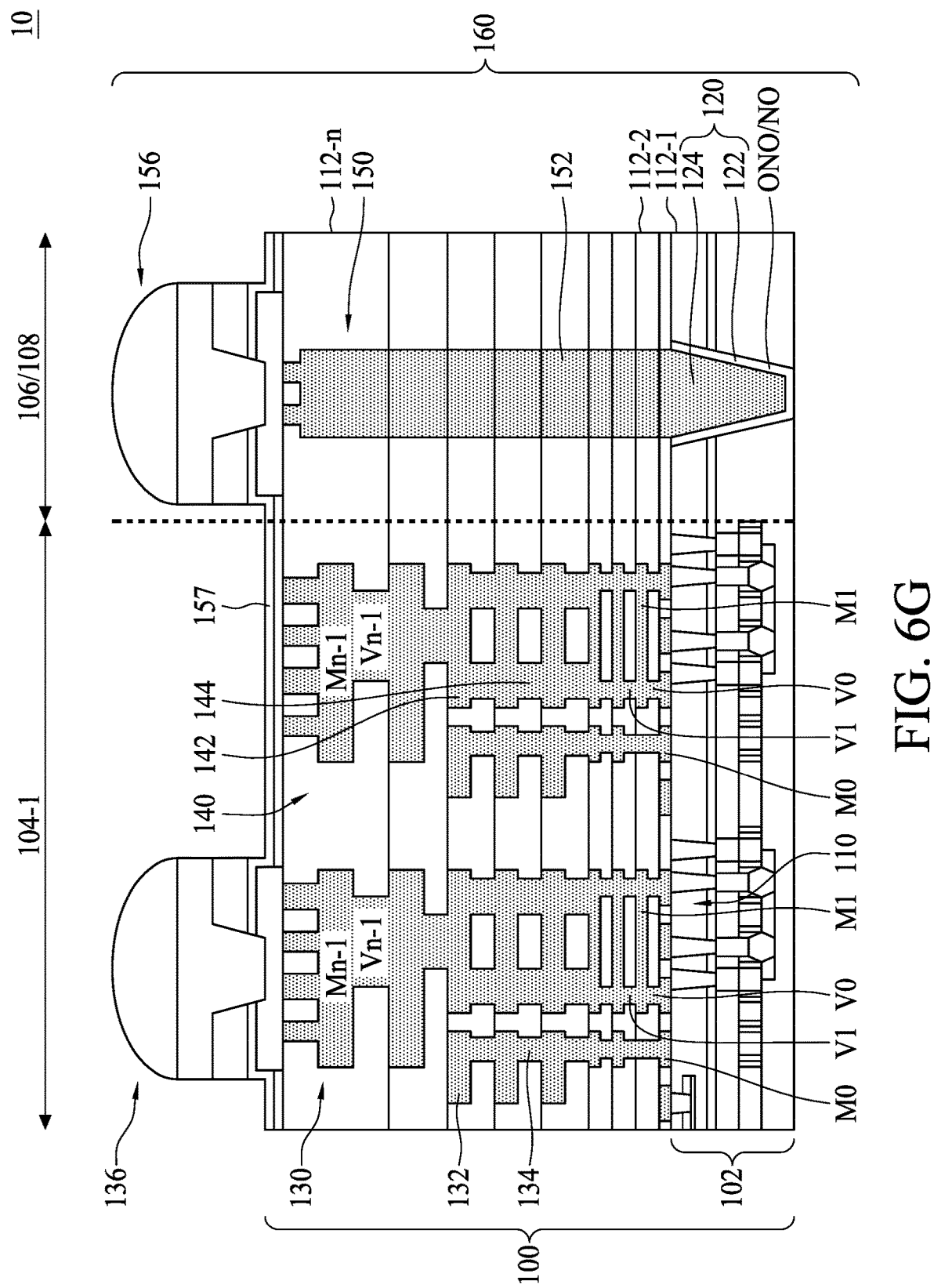

At operation 304, a bonding structure 136 is formed over the substrate 102 in the die region 104-1 and a bonding structure 156 is formed over the substrate 102 in the die scribe line region 106, simultaneously, as shown in FIG. 6G. In some embodiments, the bonding structure 136 can be formed over and electrically coupled to the connecting structure 130 and thus is electrically coupled to the semiconductor devices 110 and integrated circuits in the substrate 102 through the connecting structure 130. The bonding structure 156 can be formed over and electrically coupled to the connecting structure 150. A connecting pillar 160 including the through substrate via 120, the connecting structure 150 and the bonding structure 156 is thus obtained in the scribe line region 106, such as in the intersection 108 of the scribe line region 106. In some embodiments, the bonding structures 136 and 156 respectively can include a bonding pad, at least a connecting via electrically coupling the bonding pad to the connecting structure 130 or 150, a UBM, a bonding ball and/or a solder. In some embodiments, a passivation layer or a dielectric layer 157 is formed over the substrate 102 and the connecting structure 140 (the die seal ring).

As shown in FIG. 6G, the connecting pillar 160 including the through substrate via 120, the connecting structure 150 and the bonding structure 156 is disposed in the scribe line region 106 and penetrates the wafer 100. The connecting structure 150 is formed simultaneously with the connecting structure 140, and the bonding structure 156 is formed simultaneously with the bonding structure 136. Further, the conductive feature 152 of the connecting structure 150, the conductive line 132 of the connecting structure 130 and the conductive line 142 of the connecting structure 140 in the same dielectric layer can be formed simultaneously. Alternatively, the conductive feature 152 of the connecting structure 150, the conductive line/via 132 and 134 of the connecting structure 130, and the conductive line/via 142 and 144 of the connecting structure 140 in the same dielectric layer can be formed simultaneously. It should be noted that because the connecting structure 150 is built layer-by-layer, reduction of the mechanical strength of the wafer 100 in the method of the present disclosure is less than the reduction of the mechanical strength of the wafer caused by laser drilling in comparative methods. Further, because the connecting pillar 160 is formed with the manufacturing operations for forming the BEOL metallization 130, the die seal ring 140 and bonding structure 136, no screw is required, and thus stress caused by screwing can be eliminated.

Figure 6H:
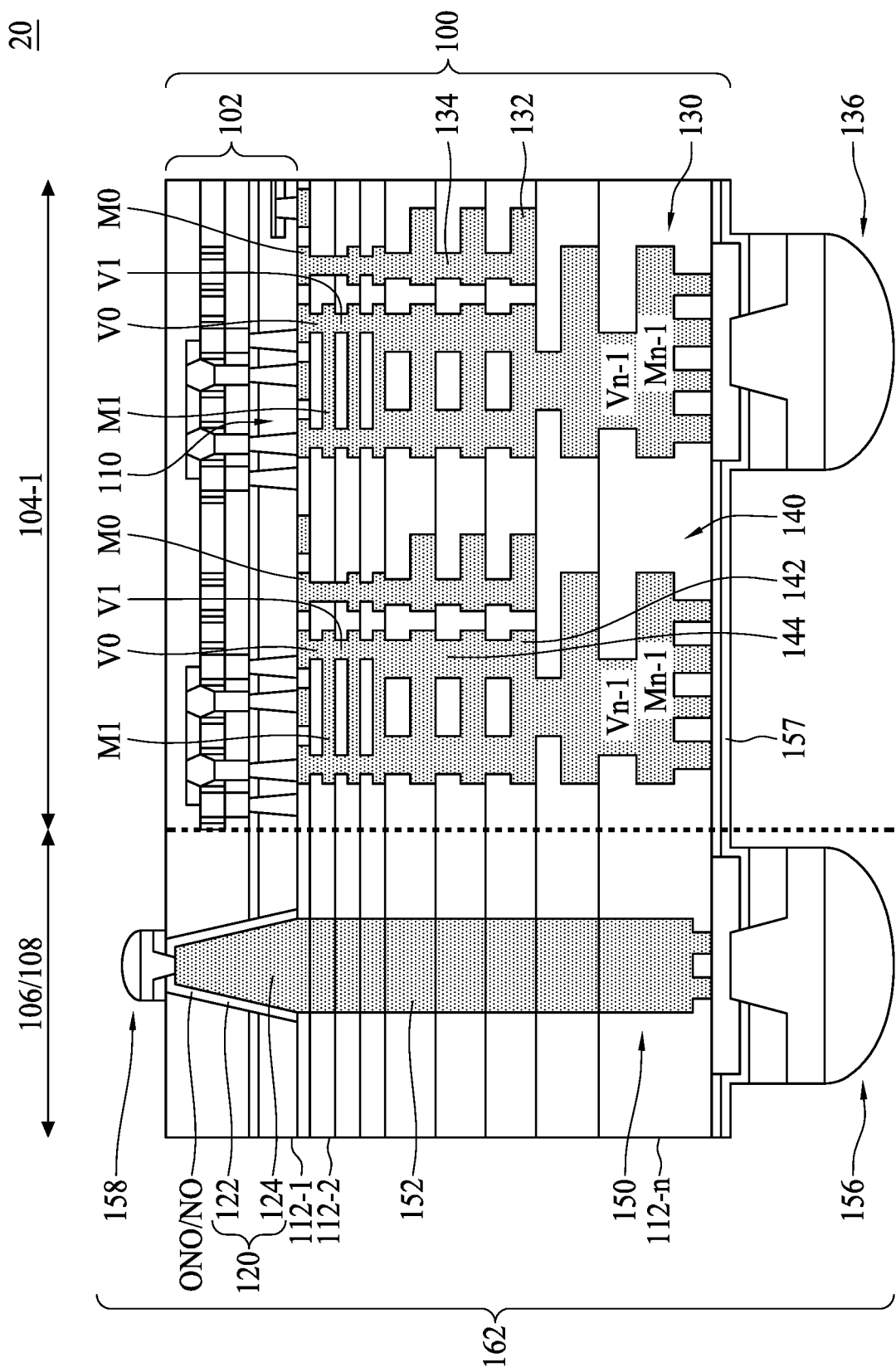

At operation 305, another bonding structure 158 is formed in the scribe line region 106 over the substrate 102 at a surface opposite to the bonding structure 156. As shown in FIG. 6H, the bonding structure 158 is aligned with and coupled to the through substrate via 120. In some embodiments, the bonding structure 156, the connecting structure 150, the through substrate via 120 and the bonding structure 158 form a connecting pillar 162. In some embodiments, the wafer 100 can be flipped over and a planarization operation can be performed to remove a portion of the substrate 102 and a portion of the insulating layer 122. Consequently, the substrate 102 may be thinned, and the conductive layer 124 of the through substrate via 120 is exposed through the surface opposite to the bonding structure 156. Subsequently, the bonding structure 158 is formed over the surface and electrically coupled to the exposed conductive layer 124 of the through substrate via 120, as shown in FIG. 6H.

Figure 6I:
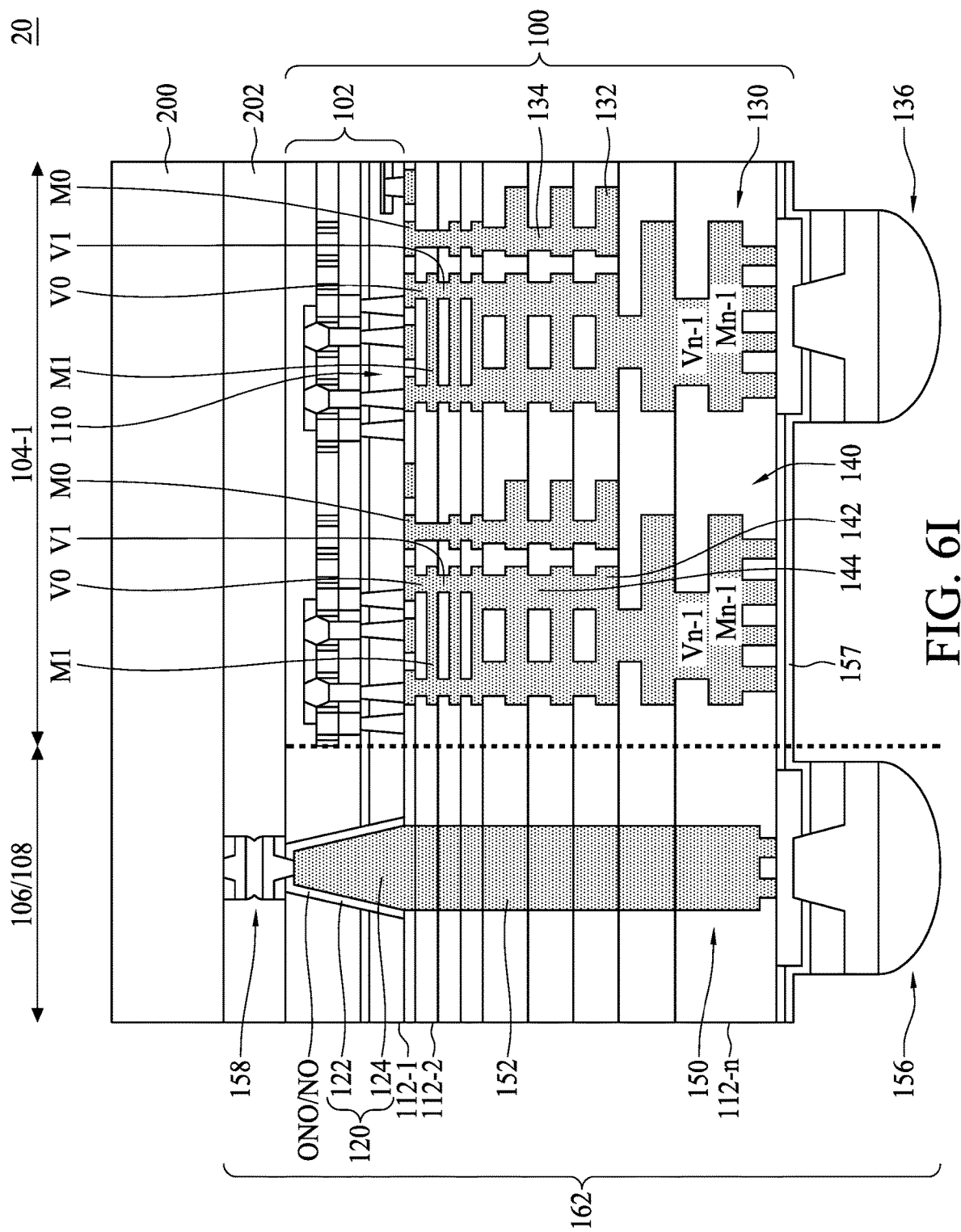

At operation 306, another substrate 200, such as a wafer or a die, is provided or received. Further, the wafer 100 is bonded to the substrate 200 through the bonding structure 158, as shown in FIG. 6I. In some embodiments, the substrate 200 can include another bonding structure substantially aligned with the bonding structure 158 over the wafer 100, and the bonding of the wafer 100 and the substrate 200 can be accomplished by the two boding structures. In some embodiments, the substrate 200 or the die 200 can be a memory die such as a DRAM die or an HBM die, but the disclosure is not limited thereto.

Still referring to FIG. 6I, in some embodiments, an underfill 202 can be applied into gaps between the substrate 102 and the substrate 200. Thus, the bonding structure 158 is surrounded by the underfill 202.

It should be noted that the wafer 100 is therefore fixed to the substrate 200 through the connecting pillar 162, which includes the bonding structure 158, the through substrate via 120, the connecting structure 150 and the bonding structure 156. Further, the substrate 102 is therefore electrically coupled to the substrate 200 through the connecting pillar 162. It should be noted that operations for forming the connecting pillar 162 can be integrated into the manufacturing operations, and the bonding between the wafer 100 and the substrate 200 can be accomplished by the bonding structure 158 of the connecting pillar 162. It is therefore concluded that the forming of the connecting pillar 162 can be integrated with the manufacturing operations without increasing process complexity.

The present disclosure therefore provides a semiconductor structure 10/20 including a connecting pillar 160/162 disposed within scribe lines 106 for securing the wafer and the substrate (or the die). The connecting pillars 160 and 162 can be formed during the forming of the wafer 100, thus reduction of the mechanical strength of the wafer 100 is mitigated. Because the laser drilling and the attachment by screw between the wafer 100 are replaced with the attachment by the connecting pillars 160 and 162, the stress issue generated from the laser drilling and the attachment by screw is eliminated. Further, because a diameter or a width of the connecting pillars 160 and 162 is less than a diameter or a width of the screw, the scribe line region 106 can be narrowed and the area of the valuable die regions 104-1, 104-2, 104-3, 104-4 and 104-n can be increased. Additionally, the pattern of the die seal ring can be simplified.

According to one embodiment of the present disclosure, a semiconductor structure is provided. The semiconductor structure includes a first substrate including a die region and a scribe line region adjacent to the die region, a through substrate via disposed in the first substrate in the scribe line region, a first connecting structure disposed over the first substrate in the die region, a second connecting structure disposed over the first substrate in the scribe line region and coupled to the through substrate via, a first bonding structure disposed over the first substrate in the die region and coupled to the first connecting structure, and a second bonding structure disposed over the first substrate in the scribe line region and coupled to the second connecting structure. In some embodiments, the through substrate via, the second connecting structure and the second bonding structure are physically and electrically separated from the first connecting structure and the first bonding structure.

According to one embodiment of the present disclosure, a semiconductor structure is provided. The semiconductor structure includes a wafer having a first die region, a second die region and a scribe line region separating the first die region and the second die region, a first die seal ring disposed in the wafer in the first die region and a second die seal ring disposed in the wafer in the second die region, and a connecting pillar disposed in the scribe line region and penetrating the wafer. In some embodiments, the connecting pillar is separated from the first die seal ring and the second die seal ring, and a height of the connecting pillar is greater than a thickness of the wafer.

According to one embodiment of the present disclosure, a method for forming a semiconductor structure is provided. The method includes following operations. A first substrate having a die region, a scribe line region adjacent to the die region, and at least a semiconductor device disposed in the die region is received. A through substrate via is formed in the first substrate in the scribe line region. A first connecting structure is formed over the first substrate in the die region, and a second connecting structure is simultaneously formed over the first substrate in the scribe line region. A first bonding structure is formed over the first substrate in the die region and a second bonding structure is formed over the first substrate in the scribe line region, simultaneously. The through substrate via, the second connecting structure and the second bonding structure are coupled to each other and separated from the semiconductor devices, the first connecting structure and the first bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first substrate comprising a die region and a scribe line region adjacent to the die region;
   a through substrate via disposed in the first substrate in the scribe line region;
   a first connecting structure disposed over the first substrate in the die region;
   a second connecting structure disposed over the first substrate in the scribe line region and coupled to the through substrate via;
   a first bonding structure disposed over the first substrate in the die region and coupled to the first connecting structure; and
   a second bonding structure disposed over the first substrate in the scribe line region and coupled to the second connecting structure,
   wherein the through substrate via, the second connecting structure and the second bonding structure are physically and electrically separated from the first connecting structure and the first bonding structure.

2. The semiconductor structure of claim 1, further comprising a dielectric layer disposed over the first substrate, wherein the first connecting structure comprises at least a conductive line disposed in the dielectric layer, and the second connecting structure comprises a conductive feature disposed in the dielectric layer.

3. The semiconductor structure of claim 2, wherein a thickness of the conductive feature of the second connecting structure, a thickness of the conductive line of the first connecting structure and a thickness of the dielectric layer are similar.

4. The semiconductor structure of claim 2, wherein the first connecting structure further comprises at least a via disposed in the dielectric layer and coupled to the conductive line.

5. The semiconductor structure of claim 4, wherein a thickness of the conductive feature of the second connecting structure, a sum of a thickness of the via and a thickness of the conductive line of the first connecting structure, and a thickness of the dielectric layer are similar.

6. The semiconductor structure of claim 1, further comprising at least a semiconductor device disposed in the first substrate in the die region, wherein the semiconductor device is electrically coupled to the first connecting structure.

7. The semiconductor structure of claim 6, wherein the semiconductor device is separated from the through substrate via in the first substrate in the scribe line region.

8. The semiconductor structure of claim 1, further comprising a die seal ring disposed in the die region and between the first connecting structure and the second connecting structure, wherein the die seal ring is separated from the first connecting structure and the second connecting structure.

9. The semiconductor structure of claim 8, wherein a height of the first connecting structure, a height of the second connecting structure and a height of the die seal ring are similar.

10. The semiconductor structure of claim 1, further comprising a third bonding structure disposed over the first substrate over a surface opposite to the second bonding structure and coupled to the through substrate via, wherein the second bonding structure, the second connecting structure, the through substrate via and the third bonding structure are aligned with each other.

11. The semiconductor structure of claim 10, further comprising:
    a second substrate bonded to the first substrate through the third bonding structure; and
    an underfill surrounding the third bonding structure.

12. A semiconductor structure, comprising:
    a first substrate having a first die region, a second die region and a scribe line region separating the first die region and the second die region;
    a first die seal ring disposed in the first substrate in the first die region and a second die seal ring disposed in the first substrate in the second die region; and
    a connecting pillar disposed in the scribe line region and penetrating the first substrate,
wherein the connecting pillar is separated from the first die seal ring and the second die seal ring, and a height of the connecting pillar is greater than a thickness of the first substrate.

13. The semiconductor structure of claim 12, wherein the connecting pillar comprises a through substrate via disposed in the first substrate, a connecting structure disposed over the first substrate, and a bonding structure disposed over the connecting structure, and a height of the through substrate via is similar to the thickness of the first substrate.

14. The semiconductor structure of claim 12, wherein the scribe line region comprises an intersection, and the connecting pillar is disposed in the intersection.

15. The semiconductor structure of claim 12, further comprising a second substrate disposed over the connecting pillar, wherein the first substrate is bonded and fixed to the second substrate through the connecting pillar.

16. The semiconductor structure of claim 15, wherein the second substrate overlaps a portion of the scribe line region.

17. A method for forming a semiconductor structure, comprising:
    receiving a first substrate having a die region, a scribe line region adjacent to the die region, and at least a semiconductor device disposed in the die region;
    forming a through substrate via in the first substrate in the scribe line region;
    forming a first connecting structure over the first substrate in the die region and a second connecting structure over the first substrate in the scribe line region simultaneously; and
    forming a first bonding structure over the first substrate in the die region and a second bonding structure over the first substrate in the scribe line region simultaneously,
wherein the through substrate via, the second connecting structure and the second bonding structure are coupled to each other and separated from the semiconductor device, the first connecting structure and the first bonding structure.

18. The method of claim 17, wherein the forming of the first connecting structure and the second connecting structure further comprises:
    forming a dielectric layer over the first substrate; and
    forming a conductive line in the die region and a conductive feature in the scribe line region in the dielectric layer, simultaneously,
wherein a thickness of the dielectric layer and a thickness of the conductive feature in the scribe line region are similar.

19. The method of claim 18, further comprising forming a via in the dielectric layer in the die region, wherein the thickness of the dielectric layer, the thickness of the conductive feature, and a sum of a thickness of the conductive line and a thickness of the via are similar.

20. The method of claim 17, further comprising:
    forming a third bonding structure in the scribe line region over the first substrate on a surface opposite to the second bonding structure; and
    bonding the first substrate to a second substrate through the third bonding structure,
wherein the second bonding structure, the second connecting structure, the through substrate via, and the third bonding structure are aligned with each other and coupled to each other to form a connecting pillar.

* * * * *